United States Patent [19]

Kosiak et al.

[11] Patent Number: 4,918,026
[45] Date of Patent: Apr. 17, 1990

[54] PROCESS FOR FORMING VERTICAL BIPOLAR TRANSISTORS AND HIGH VOLTAGE CMOS IN A SINGLE INTEGRATED CIRCUIT CHIP

[75] Inventors: Walter K. Kosiak; Douglas R. Schnabel; Jonathan D. Mann; Jack D. Parrish; Paul R. Rowlands, III, all of Kokomo, Ind.

[73] Assignee: Delco Electronics Corporation, Kokomo, Ind.

[21] Appl. No.: 325,164

[22] Filed: Mar. 17, 1989

[51] Int. Cl.[4] .......................................... H01L 21/265
[52] U.S. Cl. ......................................... 437/33; 437/31; 437/59; 437/34; 357/43
[58] Field of Search ............... 437/31, 32, 33, 34, 437/41, 44, 45, 51, 54, 59; 357/34, 43, 59

[56] References Cited
U.S. PATENT DOCUMENTS

| | | | |
|---|---|---|---|
| 3,576,475 | 4/1971 | Kranlage | 357/43 |
| 4,047,217 | 9/1977 | McCaffrey | 357/43 |
| 4,475,279 | 10/1984 | Gahle | 437/59 |
| 4,503,603 | 3/1985 | Blossfeld | 437/59 |
| 4,717,686 | 1/1988 | Jacobs | 357/43 |
| 4,752,589 | 6/1988 | Schaber | 437/31 |

Primary Examiner—Brian E. Hearn
Assistant Examiner—Kevin McAndrews
Attorney, Agent, or Firm—Robert J. Wallace

[57] ABSTRACT

A process is used to form in a common substrate a PMOS transistor of the lightly doped drain (LDD) type, an NMOS transistor of the LDD type and a vertical n-p-n bipolar transistor. In particular: the steps used to form an n-type well for the PMOS transistor, and an n-type drain extension well for the NMOS transistor, are also used to form the n-type collector of the bipolar transistor; the steps used to form the p-type extension well for the PMOS transistor are also used to form the p-type base of the bipolar transistor, the source/drain implantation step for the NMOS transistor is also used to form the emitter and a contact region for the collector of the bipolar transistor; and the source/drain implantation step for the PMOS transistor is used to form a contact region for the base of the bipolar transistor.

11 Claims, 4 Drawing Sheets

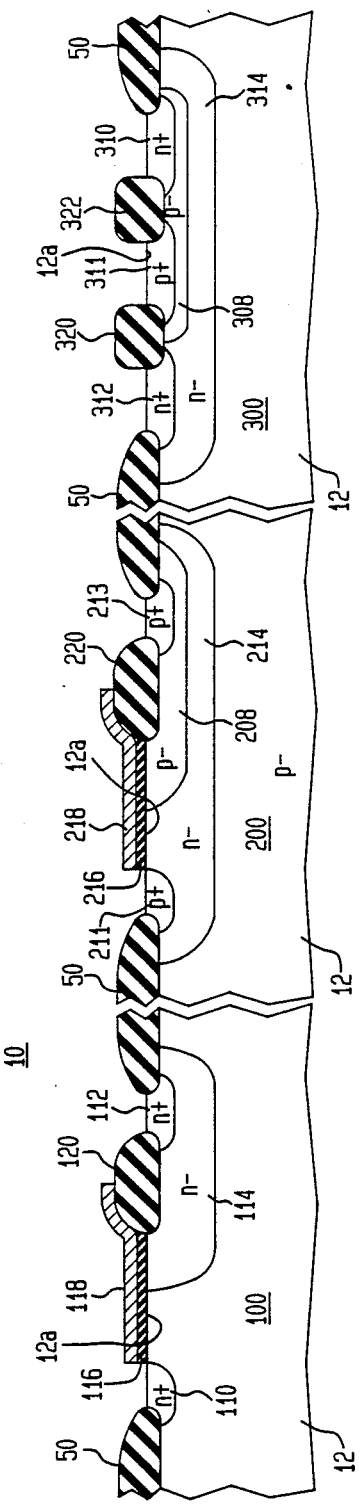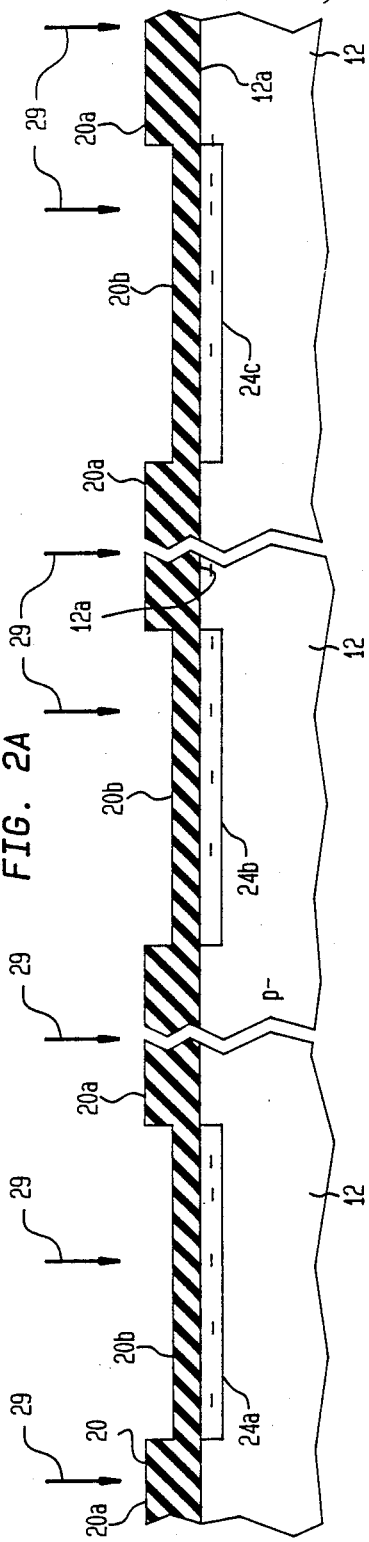

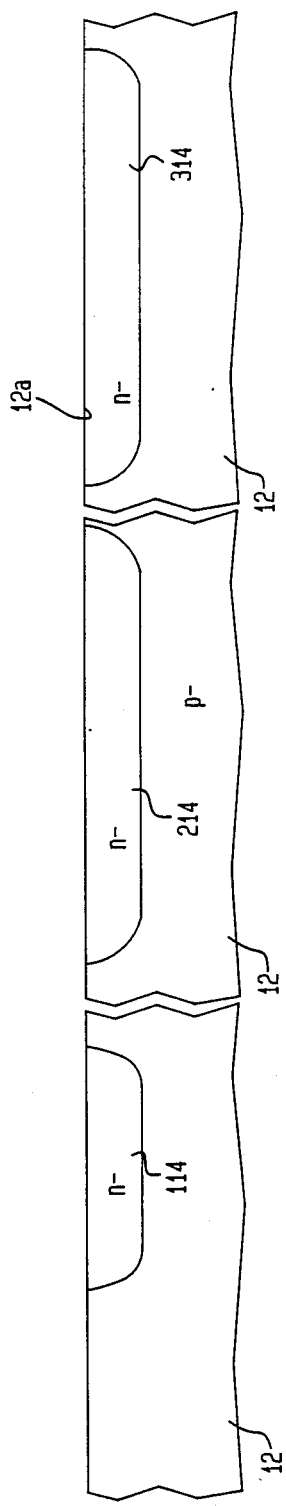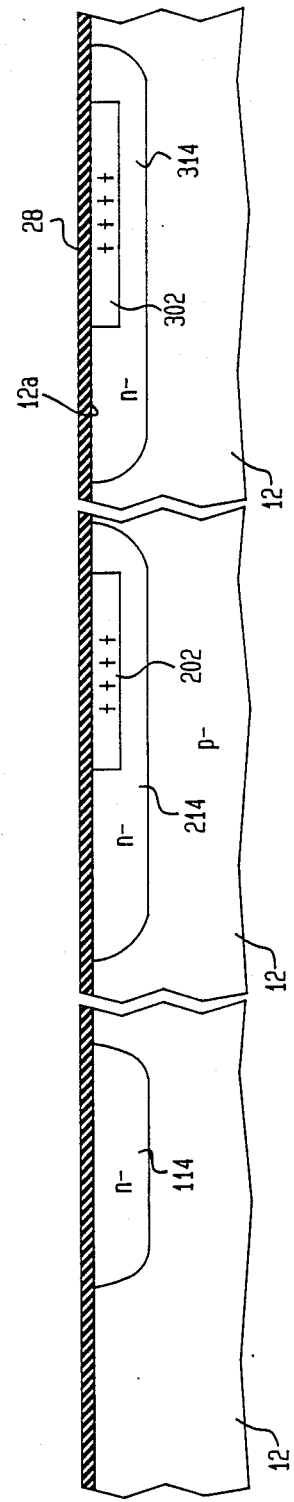

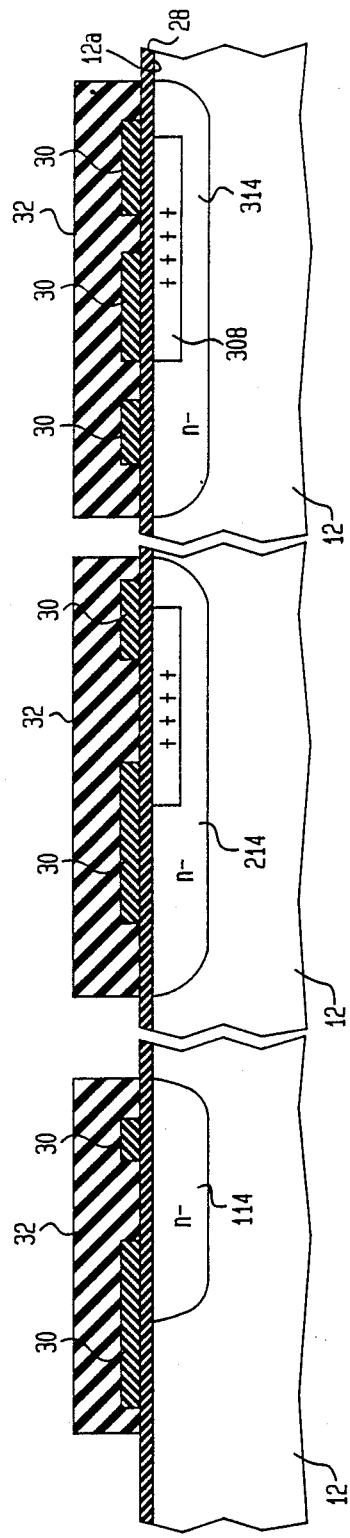
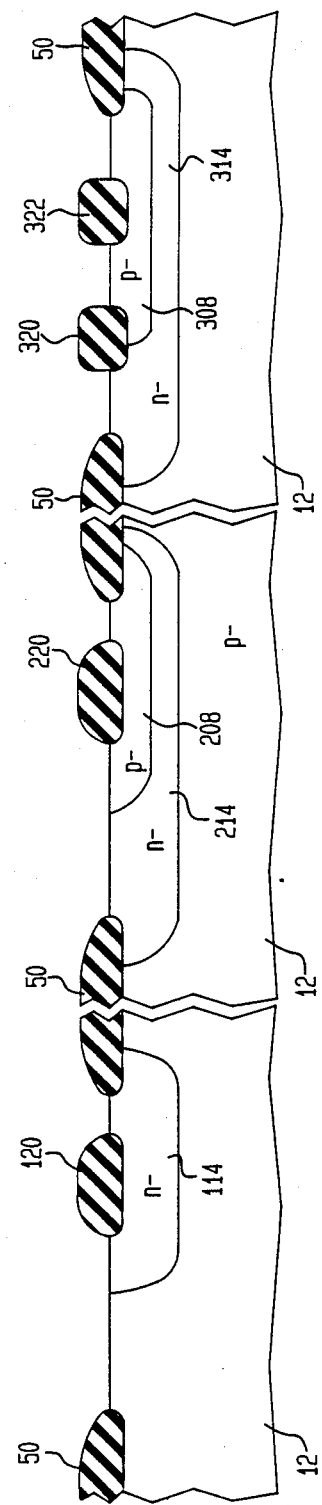

PROCESS FOR FORMING VERTICAL BIPOLAR TRANSISTORS AND HIGH VOLTAGE CMOS IN A SINGLE INTEGRATED CIRCUIT CHIP

FIELD OF THE INVENTION

This invention relates to the manufacture of semiconductive integrated circuits and, more particularly, to such circuits that include both bipolar junction transistors and metal-oxide-semiconductor (MOS) transistors in a common semiconductive substrate or chip.

RELATED PATENT APPLICATIONS

This application is related, to copending applications Ser. Nos. 324869 entitled, "Process for Forming High and Low Voltage CMOS Transistors on a Single Integrated Circuit Chip," and 324059 entitled, "Technique for Forming Thick Gate Oxide and Thin Gate Oxide Transistors in a Common Integrated Circuit Chip," which are being filed concurrently with this application and which have a common assignee and some common inventors.

BACKGROUND OF THE INVENTION

Although bipolar transistors were available before MOS transistors, in recent years the emphasis has been on MOS transistors, particularly complementary MOS (CMOS) transistors. However, bipolar transistors do have some advantages over MOS transistors, including higher transconductance, higher output impedance and faster switching speed, and, in vertical form, the ability generally to sink larger currents per unit device area.

For this reason, there are circuit applications where it is desirable to include both bipolar transistors and MOS transistors, particularly CMOS transistors. Moreover, because of the advantages of monolithic integrated circuits, it is desirable in such circuit applications to incorporate both forms of transistors in a common semiconductive substrate or individual chip.

Among the circuit applications where such a monolithic integrated circuit is expected to be useful are linear circuits, such as temperature stable voltage regulators, bandgap reference circuits, low input offset circuits, and feedback amplifier circuits.

Moreover, for ease of manufacture, it is desirable to have a fabrication process in which both bipolar and MOS transistors are essentially formed in parallel with a minimum of processing steps.

These factors have been recognized in a paper entitled, "An Isolated Vertical n-p-n Transistor in an n-Well CMOS Process", published in IEEE Journal of Solid State Circuits Vol. SC-20, No. 2, April 1985, pages 489–493. In the process described therein, a vertical n-p-n transistor is formed in a chip along with low voltage CMOS transistors by modification of a standard process to change both the dosage of the implant used to form the source and drain of the PMOS transistor and the implant anneal conditions.

SUMMARY OF THE INVENTION

The present invention is a process for forming in a common semiconductive substrate, vertical bipolar transistors and high voltage CMOS transistors of the lightly doped drain (LDD) transistor type in which the vertical n-p-n transistors are formed by the same series of steps used to form the LDD transistors with only mask modifications but no added masking steps.

In particular, in an illustrative embodiment of the invention to be described below, vertical n-p-n bipolar transistors are formed in a p-type substrate in common with LDD CMOS transistor pairs by a process in which an implant step used to form the lightly doped p-type extension wells of the PMOS transistors of each CMOS pair serves also to form a lightly doped base for each of the bipolar transistors. The implant step used in forming the heavily doped zones of the sources and drains of the PMOS transistors of each CMOS pair is used also in forming the heavily doped base contact region of each bipolar transistor. The implant step used in forming the heavily doped sources and drains of the NMOS transistors is used also in forming the emitter and the heavily doped collector contact region of each bipolar transistor. For the best results with this process, it is particularly important to tailor properly the p-type implant used for the drain extension and vertical base so that the heating step used for forming field oxidation regions can be used to drive-in this implant appropriately.

Moreover, the process may be used without any additional steps but simply by a mask change also to form in the common substrate low voltage CMOS transistor pairs that do not include lightly doped drain extensions. The details of such a process are set forth in the first of the above-identified related applications.

The invention will be better understood from the following more detailed description taken in conjunction with the accompanying drawing and claims.

BRIEF DESCRIPTION OF THE DRAWINGS

FIG. 1 shows in cross section a semiconductive chip that includes a PMOS transistor of the LDD type, an NMOS transistor of the LDD type, and a vertical n-p-n bipolar (i.e., junction) transistor; and FIGS. 2A, 2B, 2C, 2D, 2E, 2F and 2G show at selected stages a semiconductive substrate being processed to form a chip of the kind shown in FIG. 1 in accordance with an illustrative embodiment of the invention.

Figure 2F:
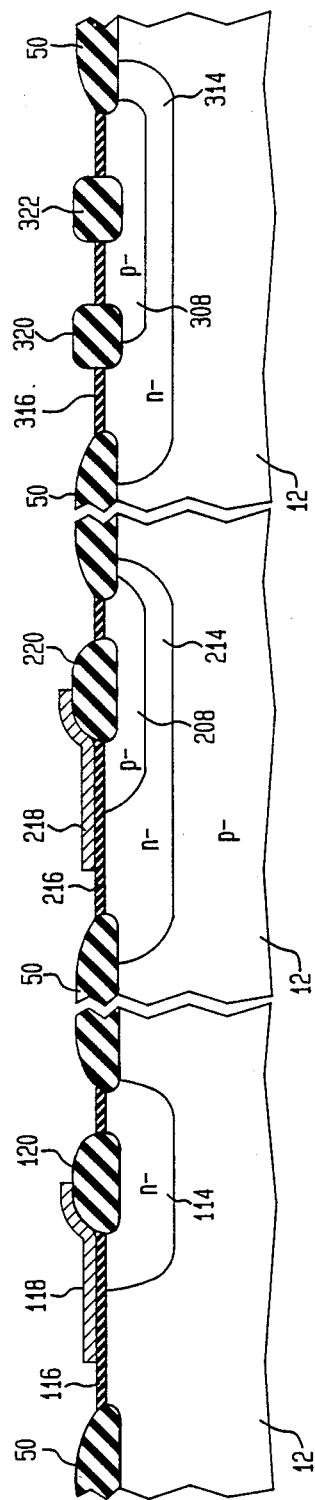

It should be noted that the drawing is not to scale.

Moreover, in the drawing, as is customary in the art, lightly doped semiconductive regions are denoted by a minus (−) sign (e.g., n−) while heavily doped semiconductive regions are denoted by a plus (+) sign (e.g., p+). Lightly doped regions are generally those that have a doping concentration of no more than about $5 \times 10^{16}$ impurities/cm$^3$ and heavily doped regions are generally those that have a doping concentration of at least $1 \times 10^{19}$ impurities/cm$^3$.

DETAILED DESCRIPTION

Referring now to FIG. 1, there is shown a monocrystalline silicon chip 10 which comprises a bulk substrate portion 12 that is lightly doped p-type. At a top surface 12a of the substrate 12 there are formed a NMOS transistor 100, a PMOS transistor 200 and a vertical n-p-n bipolar transistor 300. Each of the MOS transistors 100 and 200 is of the lightly doped drain type so as to be able to withstand without avalanche breakdown field-induced voltages between source and drain of at least about 30 volts.

The NMOS transistor 100 includes a heavily doped n-type source 110 and the heavily doped n-type drain 112. The latter is nested within a lightly doped n-type drain extension 114. A relatively thin (650 angstroms) gate oxide layer 116 overlies the p-type surface 12a region between the source 110 and the extension well 114. A polysilicon gate electrode 118 overlies gate oxide layer 116 and also overlaps a portion of a relatively thick (typically 8000 angstroms thick) field oxide region 120 to serve as a quasifield plate to increase the effective induced-field avalanche breakdown voltage of the region between the drain 112 and the source 110.

The PMOS transistor 200 is formed in a lightly doped n-type well 214 and includes a heavily doped p-type source 211 and a heavily doped p-type drain 213. The latter is formed in a lightly doped p-type extension well 208. A relatively thin oxide layer 216 (typically about 650 angstroms) overlies the n-type surface region that extends between source 211 and the drain extension well 208. A polysilicon gate electrode 218 overlies a gate oxide 216 and overlaps relatively thick (typically about 8000 angstroms) field oxide region 220 that serves as a quasi-field plate to enhance the avalanche breakdown voltage of the region between the source and drain.

The vertical n-p-n bipolar transistor 300 includes a lightly doped n-type well 314 that serves as its collector and within which is nested a lightly doped p-type well 30B that serves as its base and within which, in turn, is nested the heavily doped n-type region 310 that serves as its emitter. The top surface 12a of the substrate 12 also includes in the base region 308 a heavily doped p-type region 311 that serves as a contact region of the base, and in the collector region 314 a heavily doped n-type region 312 that serves as the contact region of the collector.

Thick field oxide regions 50 are also used at the top surface 12a of the substrate 12 to isolate the various transistors from one another in the horizontal direction in known fashion.

Layers 50, 116, 216, 120, 220, 320 and 322, although termed oxide or silicon oxide layers, as is customary in the art, are, in fact, layers predominantly of silicon dioxide.

It is characteristic of the transistors described that they are formed in parallel by common processing steps, in accordance with the invention. In particular, the lightly doped n-type wells 114, 214 and 314 are formed together by common steps, the lightly doped p-type wells 208 and 308 are formed together by common steps, the heavily doped n-type surface regions 110, 112, 310 and 312 are formed together by common steps, and the heavily doped p-type surface regions 211, 213 and 311 are formed together by common steps.

In an illustrative embodiment: the lightly doped n-type wells have an average impurity concentration of $1 \times 10^{16}$ impurities/cm$^3$ and a depth of about 4.0 microns; the lightly doped p-type wells have an average impurity concentration of about $4.0 \times 10^{16}$ impurities/cm$^3$ and a depth of about 1.0 micron; the heavily doped p-type surface regions have an average impurity concentration of about $1 \times 10^{19}$ impurities/cm$^3$ and a depth of about 0.3 micron; and the heavily doped type regions have an average impurity concentration of about $1 \times 10^{20}$ impurities/cm$^3$ and a depth of about 0.3 microns. The p-type substrate has an average impurity concentration of about $5 \times 5^{15}$ impurities/cm$^3$.

It is customary in the art to process a silicon wafer of relatively large surface area, currently typically at least 5 or 6 inches in diameter, and thereafter to dice the wafer into a large number of individual chips of smaller area. In an illustrative embodiment of the process of the invention, each of the chips includes at least one of each of the three types of transistors, as in the chip 10 of FIG. 1. The wafer generally is of a thickness sufficient to facilitate convenient handling and typically the thickness is between 23 and 26 mils. Additionally, the wafer is generally sliced so that its top surface corresponds to a <100> crystal plane.

In the subsequent figures, for the sake of simplicity, there is shown only a portion of a wafer corresponding to a single chip including only one of each of the three types as shown in FIG. 1.

Referring now to FIG. 2A, the silicon substrate 12 provided by the silicon wafer 12 has its top surface 12a treated to include thereover a mask that includes silicon oxide portions 20a that are relatively thick, e.g., about 5500 angstroms, interspersed with silicon oxide portions 20b that are relatively thin, e.g., about 500 angstroms. This is conveniently accomplished by first providing a uniform silicon oxide layer of about 5500 angstroms thickness, selectively removing portions of the layer to bare the substrate 12 where the thin portions are to be formed, and then regrowing the oxide over the bared substrate 12 to the desired thin thickness. Such thin portions of the mask correspond to regions where lightly doped n-type wells are to be formed in the substrate. The oxide portions 20b at such regions are designed to be of a thickness that protects the underlying surface, while the substrate 12 is being implanted with donor ions to form the n-type wells, but little impedes the implantation. The oxide portions 20a are of a thickness adequate to mask the underlying substrate 12 against such implantation.

Once masked, the substrate 12 is implanted with donor ions, as indicated by the arrows 29, to form the donor implanted regions 24a, 24b and 24c. In an illustrative embodiment, the dosage is $4.5 \times 10^{12}$ phosphorus ions per square centimeter at an accelerating voltage of about 125 KeV and the substrate 12 is later heated to 1200° C. for about 4 hours to drive-in the implanted ions and form the n-type wells desired.

The resultant, after drive-in and with the oxide layer 20 removed, is shown in FIG. 2B. The substrate 12 now includes lightly doped n-type wells 114, 214 and 314.

Next, acceptor-implanted regions that, after drive-in, will define the desired p-type wells are formed at the top surface of the substrate 12.

To this end, a uniform thin oxide layer 28 (e.g., about 500 angstroms thick) is formed over the top surface 12a of the substrate 12. This is then covered with a photoresist layer of a thickness adequate to mask the subsequent acceptor implantation. The photoresist is then patterned to form openings therein where the implanted acceptor ions are to be introduced into the substrate 12. This is followed by irradiation of the top surface of the substrate with boron ions to a dosage of about $1.5 \times 10^{13}$ impurities-cm$^{-2}$ at an accelerating voltage of about 120 KeV. Drive-in of the implanted acceptors advantageously is postponed to a later heating stage in the process when the thick field oxide regions are formed.

The resultant, after the remains of the photoresist layer is removed, is shown in FIG. 2C where acceptor implanted regions 202 and 302 are in n-type wells 214 and 314, respectively. Region 202 will eventually be used to form the p-type extension well of the PMOS transistor and region 302 to form the p-type base of the bipolar n-p-n transistor. The uniform thin oxide layer 28 advantageously is kept over the surface 12a to serve subsequently as a protective layer in the subsequent conventional field implant step.

Next, there are formed the various thick field oxide regions desired seen in FIG. 1.

To this end, as seen in FIG. 2D, a layer of silicon nitride 30 of a thickness adequate to serve as an oxidation mask, e.g., 2000 angstroms, is provided over the top surface 12a of the substrate 12, patterned to be left in place only where it overlies substrate regions where active regions are to be formed. In place, it will block the oxidation of the underlying substrate region.

However, before formation of the thick field oxide region, it is usually advantageous first to introduce acceptor ions at surface regions where the field oxide regions are to be formed, except where such regions overlie the n-type wells. This implant serves to protect the surface, where implanted, against undesired surface inversion in operation.

To this end, it is desirable to deposit a photoresist layer over the substrate and to remove such photoresist except over n-type well regions. It will serve to mask the subsequent field implant into the substrate.

The resultant is shown in FIG. 2D where the top surface 12a of the substrate 12 includes the uniform thin oxide layer 28, the patterned silicon nitride layer 30 and the patterned photoresist mask 32.

The field implant involves irradiation typically with boron at a dosage of about $1.4 \times 10^{13}$ ions/cm$^2$ at an accelerating voltage of 35 KeV. Since this is a shallow implant that does not change the conductivity type of the surface but only increases the acceptor concentration, the result of the implant is not reflected in the drawing.

After the field implant, the photoresist mask 32 is removed and the field oxidation step is then carried out. Because the field oxidation step tends to leach boron from the substrate 12, good control of the earlier boron implantation used to form regions 202 and 320 is important. In an illustrative embodiment, field oxide regions about 8000 angstroms thick were formed by heating the substrate to 1050° C. for 4 hours, thereby also driving in the boron implanted in regions 208 and 308 to form lightly doped p-type wells about 1 micron deep with an average concentration of $4 \times 10^{16}$ impurities/cm$^3$.

After the photoresist mask 32, the patterned silicon nitride 30 and the uniform thin oxide 28 are removed, the structure shown in FIG. 2E results. It includes the p-type substrate 12 with lightly doped n-type wells 114, 214 and 314, with lightly doped p-type well 208 formed in n-type well 214 and with lightly doped p-type well 308 in n-type well 314. Moreover, field oxide regions 50 are localized to define the active surface regions of the various transistors to be formed. Field oxide regions 120 and 220 are localized to define the quasi-field plate regions of the NMOS and PMOS transistors to be formed. Field oxide regions 320 and 322 are localized to isolate the yet-to-be formed emitter, base contact region and collector contact region of the bipolar transistor.

At this point, it is usually advantageous to provide an implantation of acceptor ions to set the potential of the surface of the substrate to better control the threshold voltage of the NMOS and PMOS transistors for operation in the desired enhancement mode.

However, before irradiation of the surface 12a with acceptor ions, a thin oxide layer, typically 400 angstroms thick, is advantageously formed over the surface to protect the surface from damage.

Irradiation of the surface 12a with boron ions at a dosage of $1.35 \times 10^{12}$ ions-cm$^{-2}$ at an accelerating voltage of 35 KeV is typical for threshold control. Since this implant is too weak to change the conductivity type but serves only to affect the surface concentration, its impact is not reflected in the drawing.

If no low voltage transistors requiring smaller thicknesses of gate oxide than the high voltage CMOS transistors are being formed in the substrate 12, the thin oxide layer now contaminated with boron is best stripped and a new thin oxide layer regrown, illustratively about 500 angstroms thick, shown as layers 116, 216 and 316 in FIG. 2F.

However, if low voltage MOS transistors are to be formed in addition to the high voltage MOS transistors, as in the earlier identified related application, there may instead then be masked the regions of high voltage MOS transistors to permit the thin boron-rich oxide layer to be removed selectively only where the low voltage MOS transistors are to be formed. Then, after removal of the mask used, a fresh thin oxide layer is grown where the low voltage MOS transistors are to be formed, and the previously formed thin oxide layer remaining where the high voltage MOS transistor are to be formed is simultaneously thickened.

Alternatively, even where both thick and thin gate oxide regions are desired, the boron-rich oxide layer may be completely stripped from the substrate and a fresh thin oxide layer regrown. This fresh layer may then be selectively removed where thin oxide layers are desired. This is followed by another oxidation step to grow a new oxide layer where thin oxide layers are desired and to thicken the earlier formed oxide layer where thick gate oxide layers are desired.

After formation of the oxide layers 116, 216 and 316, the polysilicon gate electrodes of the CMOS transistors are formed, as shown in FIG. 2F.

To this end, a uniform layer of polysilicon, illustratively 3500 angstroms thick deposited by low pressure chemical vapor deposition, is formed over the top surface of the substrate. Before patterning the polysilicon, it is usual to dope the polysilicon layer with phosphorus to increase its conductivity.

The polysilicon layer is then patterned in the usual fashion to form the polysilicon electrodes. As seen in FIG. 2F, doped polysilicon gate electrode 118 overlaps the field oxide region 120 and extends over a portion of the thin gate oxide layer 116 and doped polysilicon gate electrode 218 overlapping the field oxide region 220 and extending over a portion of the thin gate oxide layer 216.

There remain to be formed the heavily doped n-type regions 110, 112, 310, 312 (see FIG. 1) that will serve as the source and drain of the NMOS transistor and as the emitter and collector contact regions of the n-p-n transistor, respectively, and the heavily doped p-type regions 211, 213, 311 (see FIG. 1) that will serve as the source and drain of the PMOS transistor and as the base contact region of the NPN transistor, respectively.

It is often advantageous, before forming such heavily-doped regions, to oxidize lightly the surface of the polysilicon electrodes to buffer the polysilicon and to minimize the effect of the photoresist mask with which it is coated during the formation of such heavily doped regions. Heating in an oxidizing ambient at 900° C. to form an oxide layer of about 225 angstroms over the polysilicon is sufficient.

It is advantageous to form the heavily doped n-type regions first. To this end, a layer of photoresist is deposited over the top surface of the substrate and then the layer is opened where the heavily-doped n-type regions are to be formed.

Advantageously, in the illustrative embodiment, these regions are formed by a double donor implantation. First, there is implanted arsenic at a dosage of about $6.5 \times 10^{15}$ impurities-cm$^{-2}$ at an accelerating voltage of about 100 KeV, followed by an implant of phosphorus at a dosage of about $1 \times 10^{14}$ impurities-cm$^{-2}$ at an accelerating voltage of about 70 KeV. It is also advantageous to follow this with an anneal at 900° C. for about 15 minutes.

Then this photoresist mask is removed and replaced by a new photoresist mask apertured to localize the implantation of boron ions that form the desired heavily doped p-type regions that will serve as the source and drain of the PMOS transistor and the base contact region of the n-p-n transistor. Illustratively, the boron is introduced by way of BF$_2$ at a dosage of $3 \times 10^{15}$ impurities-cm$^{-2}$ at an accelerating voltage of 70 KeV.

Figure 2G:
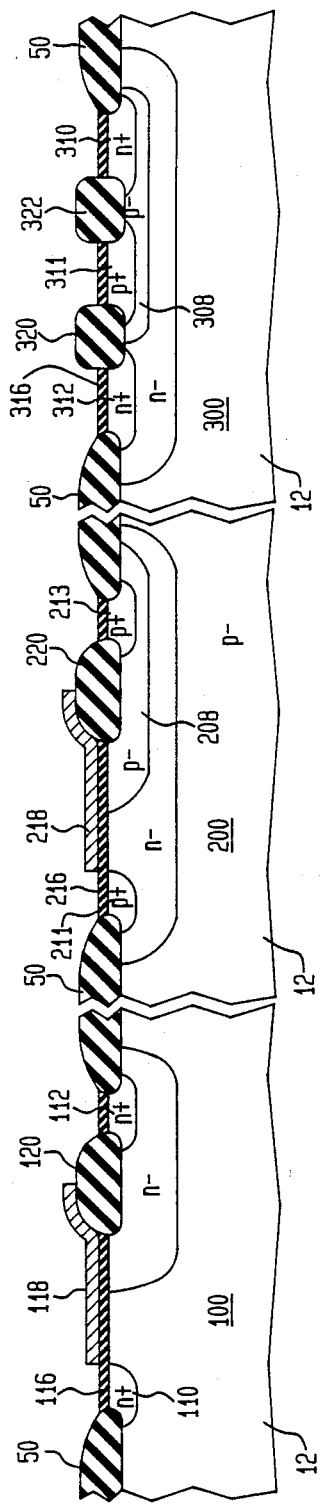

The resultant is shown in FIG. 2G, which is essentially the same as FIG. 1. The substrate 12 now includes the heavily doped n-type source 110 and drain 112 of the NMOS transistor 100, heavily doped p-type source 211 and drain 213 of the PMOS transistor 200, and the heavily doped n-type emitter 310, collector contact 312 and heavily doped p-type base contact 311 of the n-p-n bipolar transistor 300. As seen, the field oxide regions 320 and 322 separate from one another the collector and base contact regions, 312, 311 and the emitter 310, advantageously to reduce surface leakage currents.

There remains the need to provide metal contacts to the various transistor elements to permit their interconnection to one another and to the outside world.

Various techniques are available for this purpose, and the invention is not dependent on any particular technique.

In an illustration embodiment, there is employed the technique described in detail in the earlier mentioned related application to which reference is made for the particulars. Basically, this technique involves: depositing a first coating of phosphosilicate glass; planarizing the first coating with a second coating of spin-on-glass (sog); forming contact openings in the two coatings for the first level metal, illustratively an alloy of aluminum, silicon and copper; depositing and patterning the first level metal to form the various source, drain, gate electrode contacts of the MOS transistors and the emitter, base and collector contacts of the n-p-n transistor; forming a dielectric layer to separate the first metal layer from the subsequently deposited second metal layer by depositing in turn a plasma deposited oxide layer, and a sog followed by an etchback planarization; followed by a redeposition of plasma oxide to a desired thickness, then forming vias in the dielectric layer to the various first level metal regions to be contacted by the second level metal; depositing the second level metal, illustratively the same alloy as the first level metal; patterning the second level metal as needed; depositing a passivating layer over the substrate; and patterning the passivating layer to expose pads by which the individual chips into which the wafer is diced can be connected to an operating system.

It is to be understood that the specific embodiment described is merely illustrative of the general principles involved and that various modifications will be apparent consistent with the spirit and scope of the inventor. In particular, the various parameters of the particular steps involved, including, in some instances, their order, can be varied as desired to achieve a particular design. Moreover, it should be feasible if desired to substitute a vertical p-n-p bipolar transistor by starting with an n-type substrate and making the related appropriate changes in the processing. Additionally, as pointed out earlier, if desired, the process can readily be adapted also to include low voltage CMOS transistors that are free of lightly doped drain extensions, as described in the previously discussed related application.

The embodiments of the invention in which an exclusive property or privilege is claimed are defined as follows:

1. A process for forming in a common substrate a PMOS transistor of the lightly doped drain type, an NMOS transistor of the lightly doped drain type, and a vertical n-p-n bipolar transistor comprising the steps of:
    forming simultaneously in a p-type semiconductive substrate a first set of at least three relatively lightly doped n-type wells;
    forming simultaneously in a first and a second well of said first set of n-type wells a first and a second relatively lightly doped p-type well for serving as a lightly doped drain extension of the PMOS transistor and as the base of n-p-n transistor, respectively;
    forming simultaneously a relatively heavily doped n-type surface region in a third well of said first set of n-type wells for serving as the drain of an NMOS transistor and a relatively heavily doped n-type surface region in the p-type substrate for serving as the source of said NMOS transistor, a relatively heavily doped n-type surface region in the second p-type well for serving as the emitter of the n-p-n bipolar transistor and a relatively heavily doped n-type surface region in the second n-type well for serving as the collector contact region of the n-p-n bipolar transistor;
    forming simultaneously a relatively heavily doped p-type region in the first p-type well for serving as the drain of the PMOS transistor, a relatively heavily doped p-type surface region in the first n-type well for serving as the source of the PMOS transistor, and a relatively heavily doped p-type surface region in the second p-type well for serving as the base contact region of the n-p-n bipolar transistor; and
    providing polysilicon gate electrodes to the PMOS and NMOS transistors.

2. The process of claim 1 in which the semiconductive substrate is monocrystalline silicon.

3. A process for forming in a common substrate a PMOS transistor of the lightly doped drain type, an NMOS transistor of the lightly doped drain type, and a vertical n-p-n bipolar transistor comprising the steps of:
    forming simultaneously in a p-type semiconductive substrate a first set of at least three relatively lightly doped n-type wells;
    forming simultaneously in a first and a second well of said first set of n-type wells a first and a second relatively lightly doped p-type well for serving as a lightly doped drain extension of the PMOS transistor and as the base of n-p-n transistor, respectively;
    forming field oxide regions on the substrate, while driving in acceptor implanted ions for forming the first and second lightly doped p-type wells;
    forming simultaneously a relatively heavily doped n-type surface region in a third well of said first set of n-type wells for serving as the drain of an NMOS transistor and a relatively heavily doped n-type surface region in the p-type substrate for serving as the source of said NMOS transistor, a relatively heavily doped n-type surface region in the second p-type well for serving as the emitter of the n-p-n bipolar transistor and a relatively heavily doped n-type surface region in the second n-type well for serving as the collector contact region of the n-p-n bipolar transistor;

forming simultaneously a relatively heavily doped p-type region in the first p-type well for serving as the drain of the PMOS transistor, a relatively heavily doped p-type surface region in the first n-type well for serving as the source of the PMOS transistor, and a relatively heavily doped p-type surface region in the second p-type well for serving as the base contact region of the n-p-n bipolar transistor; and providing polysilicon gate electrodes to the PMOS and NMOS transistors.

4. The process of claim 3 in which the forming in the substrate of the first set of the relative)y lightly doped n-type wells utilizes a common donor ion implantation step through a mask apertured to define the three wells.

5. The process of claim 4 in which the forming, in the first and second well of the first set, of the first and second relatively lightly doped p-type wells utilizes a common acceptor ion implantation step through a mask apertured to define said first and second p-type wells.

6. The process of claim 5 in which the common donor ion implantation to form the first set of n-type wells is a phosphorus implantation and the common acceptor ion implantation to form the first and second p-type wells is a boron implantation.

7. The process of claim 5 in which the forming of the relatively heavily doped n-type surface regions utilizes a common pair of donor ion implantation steps through a mask apertured to define the source and drain of the NMOS transistor, the emitter of the n-p-n transistor and the collector contact region of the n-p-n transistor.

8. The process of claim 7 in which the forming of the relatively heavily doped p-type regions utilizes a common acceptor ion implantation through a mask apertured to define the source and drain of the PMOS transistor and the base contact region of the n-p-n transistor.

9. The process of claim 7 in which a common pair of donor ion implantation steps include common arsenic and phosphorus implantation steps.

10. The process of claim 9 in which the forming of the relatively heavily doped p-type regions utilizes a common boron ion implantation step through a mask apertured to define the source and drain of the PMOS transistor and the base contact region of the n-p-n transistor.

11. The process of claim 3 in which the semiconductive substrate is monocrystalline silicon.

* * * * *